Figure 1:
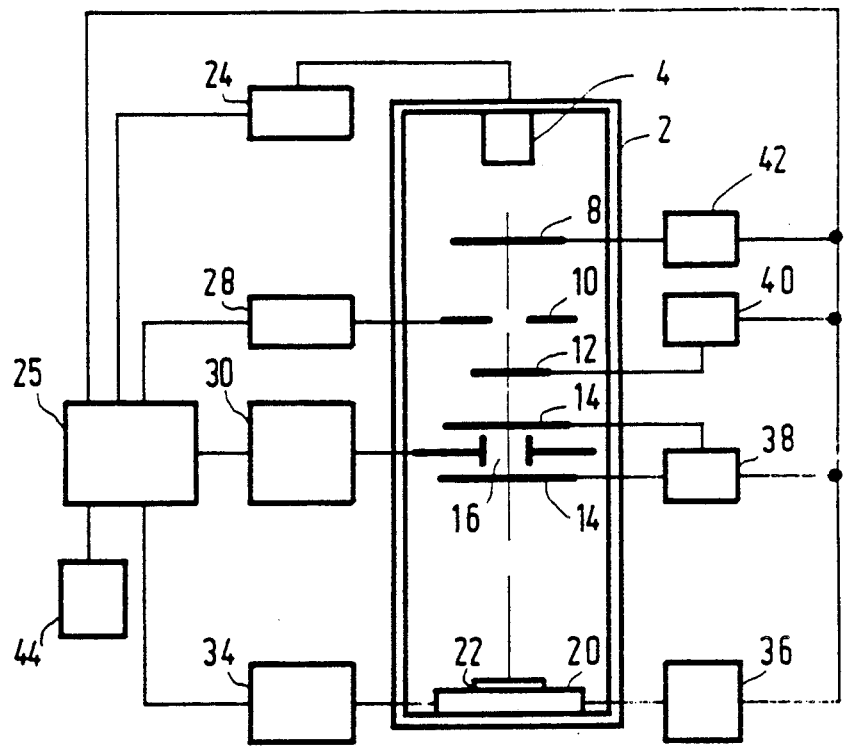

United States Patent [19]

van der Mast

[11] Patent Number: 5,001,349

[45] Date of Patent: Mar. 19, 1991

[54] CHARGED-PARTICLE BEAM APPARATUS

[75] Inventor: Karel D. van der Mast, Pijnacker, Netherlands

[73] Assignee: U.S. Philips Corporation, New York, N.Y.

[21] Appl. No.: 549,652

[22] Filed: Jul. 9, 1990

Related U.S. Application Data

[63] Continuation of Ser. No. 253,792, Oct. 5, 1988, abandoned.

[30] Foreign Application Priority Data

Oct. 29, 1987 [NL] Netherlands ............... 8702570

[51] Int. Cl.$^5$ .................. H01J 37/09; H01J 37/20
[52] U.S. Cl. ..................... 250/396 R; 250/398; 250/492.2; 250/492.3
[58] Field of Search ........... 250/396 R, 492.2, 423 R, 250/396 ML, 310, 398, 492.3

[56] References Cited

U.S. PATENT DOCUMENTS

| | | | |
|---|---|---|---|
| Re. 29,500 | 12/1977 | Hoppe | 250/396 ML |
| 3,745,494 | 7/1973 | Sawyer | 250/396 R |
| 4,097,745 | 6/1978 | Parks | 250/396 R |
| 4,136,285 | 1/1979 | Anger et al. | 250/492.2 |
| 4,153,843 | 5/1979 | Pease | 250/396 R |
| 4,246,487 | 1/1981 | Anger et al. | 250/396 R |
| 4,325,084 | 4/1982 | van Gorkom et al. | 358/241 |
| 4,419,580 | 12/1983 | Walker et al. | 250/396 R |
| 4,524,277 | 6/1985 | Shimura et al. | 250/396 R |
| 4,568,833 | 2/1986 | Roelofs | 250/396 R |
| 4,724,328 | 2/1988 | Lischke | 250/396 R |
| 4,810,889 | 3/1989 | Yokomatsu et al. | 250/492.2 |

FOREIGN PATENT DOCUMENTS 0213664 3/1987 European Pat. Off. .

Primary Examiner—Jack I. Berman
Assistant Examiner—Kiet T. Nguyen
Attorney, Agent, or Firm—Paul R. Miller

[57] ABSTRACT

A charged-particle beam apparatus comprises a beam splitting/alignment system whereby individual beams or groups of individual beams can be independently aligned so that they can be brought out of focus in a focal plane of the individual beams, so that a beam limiting diaphragm arranged at that area is irradiated more uniformly with a smaller beam loss.

5 Claims, 2 Drawing Sheets

CHARGED-PARTICLE BEAM APPARATUS

This is a continuation of application Ser. No. 253,792, filed Oct. 5, 1988.

The invention relates to a charged particle beam apparatus, comprising a particle source, a beam focusing system and a beam limiting diaphragm.

A charged-particle apparatus in the form of an electron beam writing apparatus of this kind is known from U.S. Pat. No. 4,524,277. In such apparatus, but also in, for example electron microscopes, electron inspection apparatus, ion implantation apparatus etc. a beam having a comparatively high current density which is comparatively uniform across a given cross-section is often required. To achieve this, such apparatus usually utilize a beam limiting diaphragm or a beam shaper such that in a suitable location in the beam path a central portion is cut out of a beam having, for example a gaussian current density distribution. A major part of the beam current is then lost for effective use; this has several detrimental effects such as a high cathode current, high space charge effects, substantial contamination in the apparatus etc. Moreover, the current density across such a central beam portion still is far from uniform.

It is an object of the invention to mitigate these drawbacks; to achieve this, a charged-particle beam apparatus of the kind set forth in accordance with the invention is characterized in that the apparatus comprises a beam splitter and a composite beam alignment system for individually influencing the direction of individual sub-beams or groups of sub-beams.

Because sub-beams can be independently directed in an apparatus in accordance with the invention, a flatter current density distribution can be imparted to a total beam at the area of, for example a diaphragm, a crossover, a target etc. As a result, a substantially larger part of the total beam current can be effectively used and the total current intensity to be supplied by the source can be substantially reduced. Further in the optical system such a split beam actually serves as a single object with an intensity distribution which can be locally adjusted in an angle-dependent manner.

The beam alignment system in a preferred embodiment comprises a bundle of deflection elements which are grouped in an orthogonal or a circular-symmetrical system. For example, when paraxially situated sub-beams are deflected toward an optical axis less than necessary for optimum focusing, a comparatively flat current density distribution is achieved across a comparatively large surface area at that location.

A further preferred embodiment of the apparatus comprises a matrix of electron emitters and gate electrodes are provided between or around the emitters so that deflection fields can be applied such that an individual or group-bound sub-beam deflection can be realized. The emitters are arranged notably in concentric rings and the sub-beams of the emitters can be independently directed per ring.

It is to be noted that an electron beam apparatus comprising a matrix of electron emitters is known per se from European Patent EP No. 213 664. Therein the object is to split the electron beam into sub-beams over a substantial part of the beam path, so that a substantial reduction of disturbing electron-electron interaction is achieved at that area. The high total current however, is maintained and the current intensity distribution in the total beam is not improved.

Figure 3:
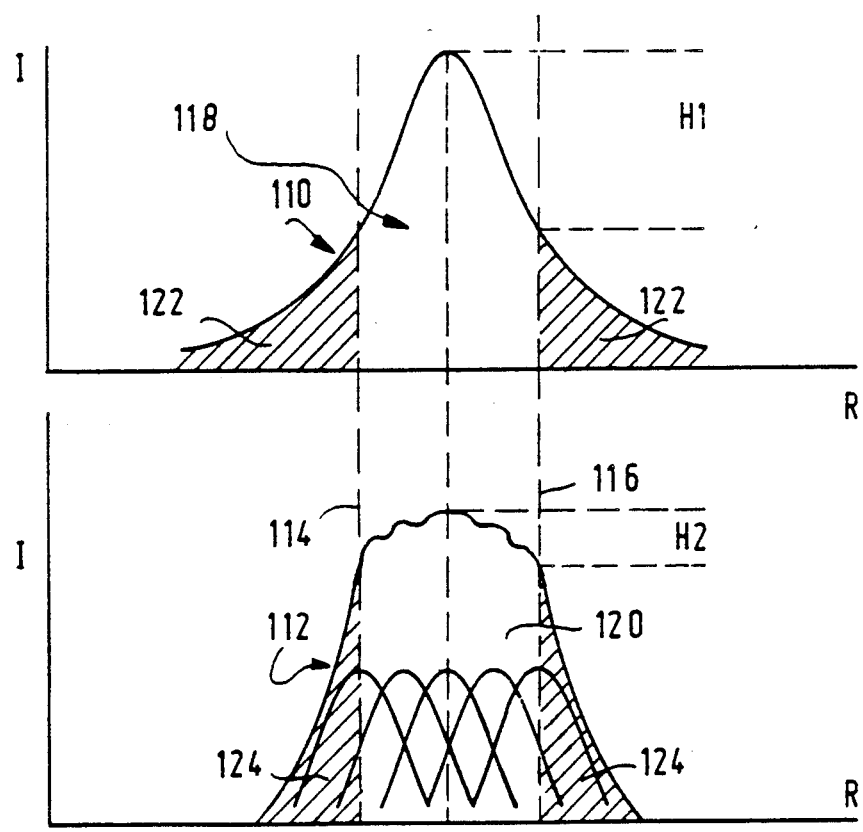
Figure 2:
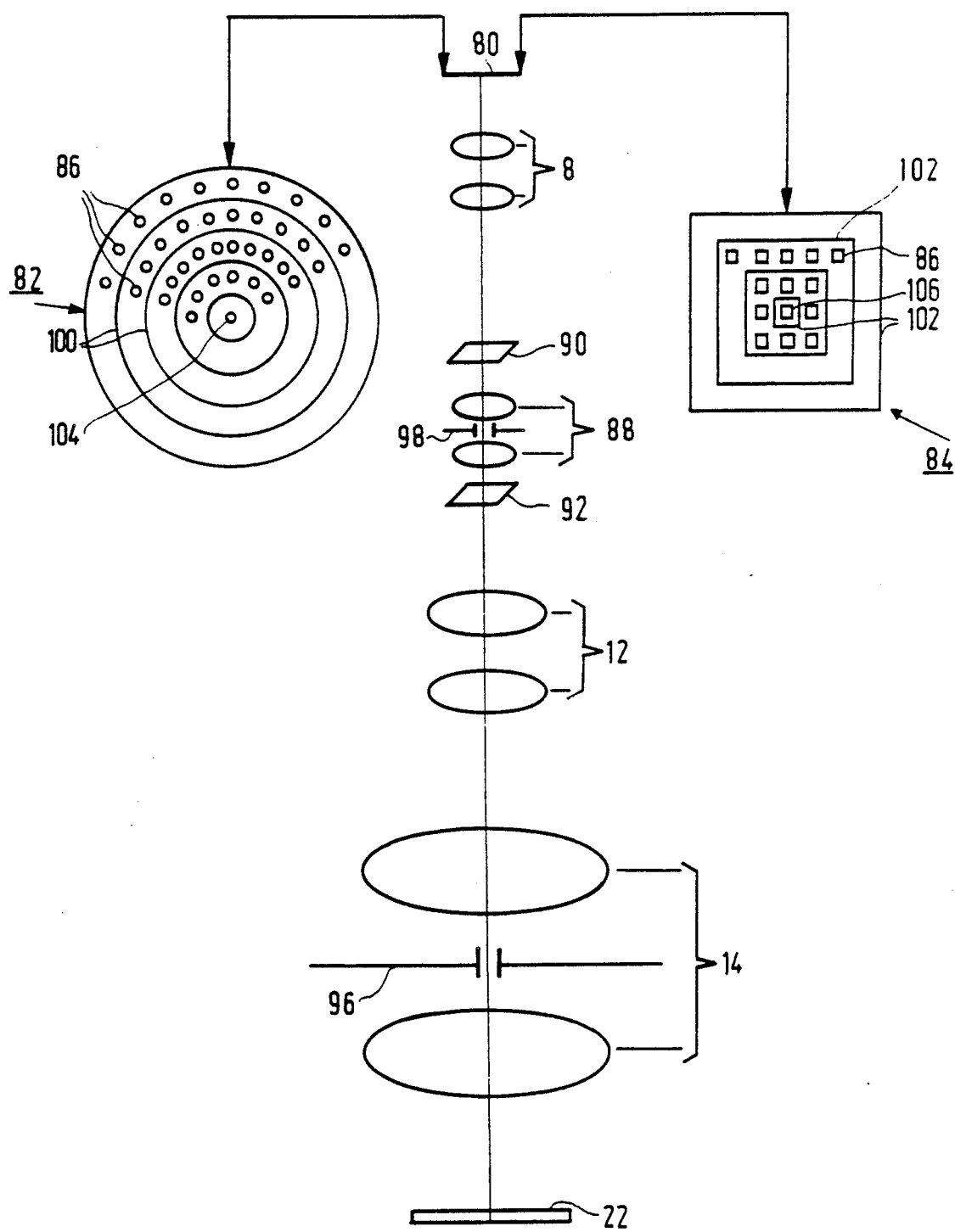

Some preferred embodiments in accordance with the invention will be described in detail hereinafter with reference to the Drawing. Therein:

FIG. 1 shows a beam writing apparatus in accordance with the invention,

FIG. 2 diagrammatically shows a particle optical system in accordance with the invention, and FIG. 3 diagrammatically shows the density distribution of beams of charged particles at the area of, for example, a diaphragm.

FIG. 1 shows a housing 2 of an electron or ion beam apparatus which accommodates a radiation source 4, a condensor lens system 8, a beam limiting diaphragm 10, a lens system 12, a composite objective lens 14, a beam deflection device 16, and an object carrier 20 on which there is arranged an object 22 to be irradiated, such as for example a silicon disc or a mask plate on which writing is to take place. In the case of an ion beam writer, the device 4 also comprises, for example an ion mass selection element.

In as far as is relevant for the invention, a major part of the optical system for the remainder is the same, ignoring adaptations to the polarity and the mass charge ratio of the various particles. For the sake of simplicity the apparatus will therefore be described hereinafter mainly as an electron beam writing apparatus. The radiation source for electrons is preferably formed by a solid state electron emitter or field emitter and for a multi-beam apparatus it is formed by an array of individual solid state emitters or field emitters. For the control of the radiation source and notably the array of individual emitters there is provided a radiation source control device 24 which is connected to a central control device 25. To the central control device there are also connected a control unit 28 for the diaphragm 10, a control device 30 for the scanning beam deflection device 16, an adjusting device 34 and a measuring device 36 for the object carrier 20, and control devices 38, 40, 42 for the objective lens system 14, the lens system 12 and the condensor lens system 8, respectively. To the central control unit there is also connected a memory reading device 44 for the storage of data and the reading of data relevant for the operations to be performed on the target plate. The construction and function of the various elements of the apparatus will be described in detail hereinafter in as far as is relevant for the invention.

The splitting of a beam of charged particles can in principle be performed anywhere in the apparatus. An example of a beam splitter is described, for example in European Patent EP No. 213 664. A beam split which is to be preferred for the use of the invention is that where the emitter produces a set of sub-beams in that the emitter comprises an array of individually emitting elements. For an electron beam apparatus as shown in FIG. 2, the emitter is preferably formed by an array of solid-state emitters, for example as described in Philips Journal of Research, Vol. 39, No. 3, 1984, pages 51–60, or by the array of field emitters as described, for example in Journal Appl. Physics, Vol. 17, No. 12, December 1976, pages 5248–5263.

Such an array of emitters comprises, for example, from a few to some tens of individual emitters, for example in a matrix comprising 5×5 emitters or in an annular configuration with, for example, up to 5 concentric rings with emitters which may also form a closed emitter in each ring. As a result of the construction of this type of emitter, a substantially random choice can be made as regards the number as well as the mutual positioning of the emitters. For example, in order to enable separate control of groups of sub-beams, they should locally be adequately spaced.

An electron-optical column for an irradiation apparatus, for example for the apparatus shown in FIG. 1, is shown in FIG. 2 and comprises a composite source 80 which comprises, for example a matrix 82 or a matrix 84 of individual emitters 86. Each of the emitters has, for example an active surface area, being a surface area where actual electron emission can occur, of, for example, $1/\mu m^2$. The spacing of the individual emitters amounts to, for example, from approximately 3 to $100/\mu m$.

The column also comprises a condensor lens system 8, a beam shaping system 88 with a diaphragm 90, a second diaphragm 92, a lens system 12 and an objective lens 14 with a deflection device 96. The shaping system 88 includes a deflection device 98 for adaptation of the direction of the beam, if necessary.

The matrix 82 is divided into 5 groups of emitters by circular electrodes 100 each group comprising an array of emitters arranged in a circle. In this case a central group comprises only a single emitter 104 or 106. It will be apparent that alternatively use can be made of groups comprising several rings of electrodes. A circular matrix is attractive when rotationally symmetrically beams are used. For rectangular of square beams, for example in cases where a rectangular beam shaper is included, the rectangular matrix 84 is also suitable. The emitters are then again arranged in groups forming substantially square ring electrodes 102 which may have rounded corners. To the electrodes 100 and 102 there is applied, for example a voltage which decreases towards the center so that beams which are situated further outwardly are focused less, thus forming a controllable beam at the area of a diaphragm.

The graphs of FIG. 3 illustrate the intensity distribution I as a function of the beam radius R of a single beam 110 and a composite beam 112, respectively, measured in a plane of, for example, a diaphragm in the beam path. A diaphragm boundary is denoted by broken lines 114 and 116 and is the same for both beams.

Portions 118 and 120 of the beams pass the diaphragm; shaded portions 122 and 124 are intercepted by the diaphragm so that they are lost for further use.

The graphs clearly show that, for at the most an equal loss of beam current, the homogeneity of the transmitted composite beam 120 is much better than that of the single beam 118. The variation in intensity is denoted by the references H2 and H1, respectively in FIG. 3.

On the other hand, beam cross-sections can be realized where the homogeneity of the composite beam is at least as good as that of the single beam, but where a much larger part of the beam current for the composite beam passes the diaphragm so that it can be effectively used. By adjustment of the local deflection devices, any compromise can be realized between the two situations so that either the homogeneity or the efficiency is optimized.

What is claimed is:

1. In an apparatus for generating a beam of charged particles comprising source means for providing a beam of charged particles, focusing means disposed downstream from said source means in the direction of flow of said beam of charged particles for focusing said beam of charged particles, diaphragm means disposed relative to said focusing means for limiting cross-section of said beam of charged particles, and object means disposed downstream of said focusing means for receiving said beam of charged particles, the improvement comprising said source means including a matrix of individual emitters of charged particles, said matrix having beam deflection electrodes for forming individual sub-beams of said charged particles, and beam control means for controlling direction to said object means of either one of individual ones of said sub-beams or of groups of said sub-beams, wherein said matrix of individual emitters of charged particles includes a plurality of semiconductor electron emitters, and wherein a composite beam of a plurality of said sub-beams is provided at said object means in a homogeneous form.

2. An apparatus according to claim 1, wherein said diaphragm means includes a circular beam limiting diaphragm, and wherein said matrix of individual emitters is oriented in concentric circles.

3. An apparatus according to claim 1, wherein said diaphragm means includes a rectangular beam limiting diaphragm, and wherein said matrix of individual emitters is oriented in an orthogonal matrix of said emitters.

4. An apparatus according to claim 1, wherein said beam control means influences said direction of said sub-beams so that paraxial sub-beams are focused less than necessary for optimum focusing in a plane of said diaphragm means.

5. An apparatus according to claim 4, wherein a flat current density distribution is provided by said beam control means over a large surface area.

* * * * *